United States Patent [19]

Sakuma et al.

[11] Patent Number: 5,670,827

[45] Date of Patent: Sep. 23, 1997

[54] PROTEIN-BASED SEMICONDUCTOR INTEGRATED CIRCUIT

[75] Inventors: Shuji Sakuma; Kiminori Atsumi; Tsutomu Ishizaki, all of Tokyo, Japan

[73] Assignee: Kabushiki Kaisha Sangi, Tokyo, Japan

[21] Appl. No.: 543,919

[22] Filed: Oct. 17, 1995

[30] Foreign Application Priority Data

Oct. 20, 1994 [JP] Japan .................. 6-279726

[51] Int. Cl.⁶ .................. H01L 23/48; H01L 23/52; H01L 29/40
[52] U.S. Cl. .................. 257/741; 257/40; 257/253; 257/632
[58] Field of Search .................. 257/741, 40, 253, 257/642, 632

[56] References Cited

U.S. PATENT DOCUMENTS 3,999,122  12/1976  Winstel et al. .................. 257/253

5,087,952  2/1992  Ribi .................. 257/253

FOREIGN PATENT DOCUMENTS 6-85240  3/1994  Japan .

*Primary Examiner*—Sara W. Crane
*Attorney, Agent, or Firm*—Christensen O'Connor Johnson & Kindness PLLC

[57] ABSTRACT

A semiconductor integrated circuit comprises a conductive protein electrode, such as cytochrome c, deposited on the surface of an apatite insulating layer such as hydroxyapatite, fluorinated apatite or chlorinated apatite. The apatite insulating layer is thin film coated onto a substrate such that it is substantially C-axis (002) oriented, which allows the integrated circuit to be of small size while minimizing undesired electron transfer between electrodes because the conductive protein electrode adopts the orientation of the apatite insulating film.

13 Claims, 1 Drawing Sheet

PROTEIN-BASED SEMICONDUCTOR INTEGRATED CIRCUIT

BACKGROUND

This invention relates to a semiconductor circuit having an electrode of an electric conductive protein (such as cytochrome c) and/or an organella (such as mitochondria) containing electric conductive proteins on an insulating film of apatite (for example, hydroxyapatite or fluorinated apatite) deposited on a substrate.

In general, a conventional semiconductor circuit can be formed by the thin film method wherein the semiconductor has a substrate layer, an insulating layer, and a conductive layer. For example, an "n"-type semiconductor is formed with a pure silicon monocrystal substrate, an insulating film such as $SiO_2$, a small amount of one or more V valency elements such as As, P and Sb, and a conductive metal electrode. A "p"-type semiconductor is similarly formed, but uses a small amount of one or more III valency elements such as B, Ga and In. A thermal oxidation process, CVD process, or anodic oxidation process, for example, is used for the formation of the insulating $SiO_2$ film layer. The formed $SiO_2$ film is processed in a desired shape by photolithography and the "n" or "p" type area is formed by an impurity diffusion process in areas where $SiO_2$ does not exist. Thereafter, a conductive metal electrode such as Al or Au is deposited. This electrode must be formed in a definite position as a uniformly smooth film to avoid the reaction of the metal film with an impurity, for example, contaminated $O_2$.

The selection of a silicon substrate is an important factor for a semiconductor circuit; and it is also clear that the formation of an insulating film of $SiO_2$ and a metal electrode affects its properties. However, sometimes the functioning of a semiconductor circuit is deteriorated by electron transfer from one electrode to another because of the close proximity of adjacent electrodes.

Therefore, narrow line widths of the metal electrode and short distances between the circuits are preferred for effective semiconductor circuits. At present the line width of a metal electrode is 0.1 µm, at minimum, and the distance between the circuits is 0.2 µm, at minimum.

The inventors have disclosed in Japanese Patent Laid-Open Publication No. Hei 6-85240 an effective semiconductor circuit comprising a conductive protein deposited on an insulating film of phosphate, which is in turn deposited on a silicon substrate. The line width of the metal electrode and the distance between circuits are narrowed due to the lack of electron transfer from one electrode to another. However, this semiconductor circuit requires the insulating film to have an A-axis (001) oriented which, in turn, dictates the directional alignment and orientation of the conductive protein.

SUMMARY

The present invention is a semiconductor integrated circuit which is effective due to the narrowness of the line width and circuit distance.

This invention relates to a semiconductor circuit having an electrode of an electric conductive protein (such as cytochrome c) and/or an organella (such as mitochondria) containing electric conductive proteins on an insulating film of apatite (for example, hydroxyapatite, fluorinated apatite, or chlorinated apatite) deposited on a substrate.

DETAILED DESCRIPTION OF THE PREFERRED EMBODIMENT

Figure 1:
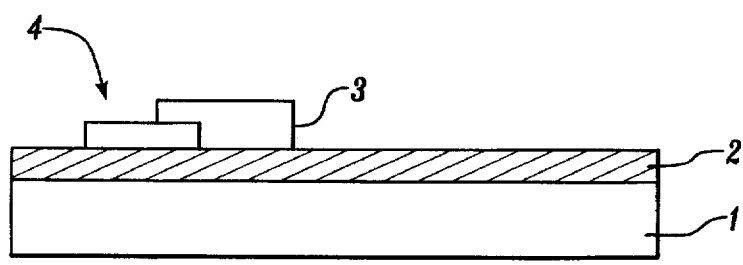
FIG. 1 is a schematic cross-section of the semiconductor integrated circuit of the present invention.

Referring to FIG. 1, substrate 1, comprised of a material known in the art such as polypropylene, acryl, glass or tetrafluoro ethane ("TEFLON") has an insulating layer 2 formed thereon. Insulating layer 2 is a substantially C-axis (002) oriented apatite film formed on substrate 1 by sputtering or ionplating, for example. Insulating layer 2 is preferably an apatite selected from hydroxyapatite, fluorinated apatite, or chlorinated apatite ($Ca_5(F,Cl$ or $OH)(PO_4)_3$). This insulating layer 2 is thus a thin crystal film oriented in a definite direction (C-axis (002)) which enables a conductive protein, such as cytochrome c, to be aligned in a specific direction to form conductive protein electrode layer 3. In this manner, semiconductor integrated circuit 4 is formed.

According to the present invention, a conductive protein, such as cytochrome c, is arranged in a specific, definite direction on any substrate, irrespective of the substrate kind or the direction of orientation of the substrate molecules. The semiconductor circuit 4 of the present invention has narrower electrode line widths and a minimal distance between respective semiconductor circuits 4 due to the fact that the conductive protein electrode layer 3 is firmly fixed in, and aligned in direction with, the apatite, which minimizes undesired electron transfer.

While cytochrome c is the most preferred cytochrome for use in protein electrode layer 3, cytochrome $a_1$, b, $b_1$, $b_2$, $b_3$, $b_6$, $c_2$ and $c_3$ can also be employed. The cytochrome employed can be obtained from algae, yeast, bacteria, protozoa or mammals. Additionally, instead of the use of an electric conductive protein (such as cytochrome c) per se, an organella such as mitochondria containing an electric conductive protein (such as cytochrome c) can be employed in protein electrode layer 3.

The present invention will next be explained in further detail by the following Examples.

EXAMPLE 1

Acryl, polypropylene and glass substrates with a hydroxyapatite film layer deposited thereon were obtained using an RF premagnetron process under the following operation conditions:

Target: Hydroxyapatite
Substrate: Acryl, polypropylene, glass
Sputtering Gas: Ar
Sputtering Pressure: $4 \times 10^{-2}$ Torr
Substrate Temperature: 40° C.
Substrate Voltage: 200 V
Operation Time: 10 hours

EXAMPLE 2

"TEFLON" substrate with a fluorinated apatite film layer deposited thereon was obtained using an RF premagnetron process under the following operation conditions:

Target: Fluorinated apatite
Substrate: "TEFLON"
Sputtering Gas: Ar
Sputtering Pressure: $4 \times 10^{-2}$ Torr
Substrate Temperature: 40° C.

Substrate Voltage: 200 V
Operation Time: 10 hours

EXAMPLE 3

Figure 2:
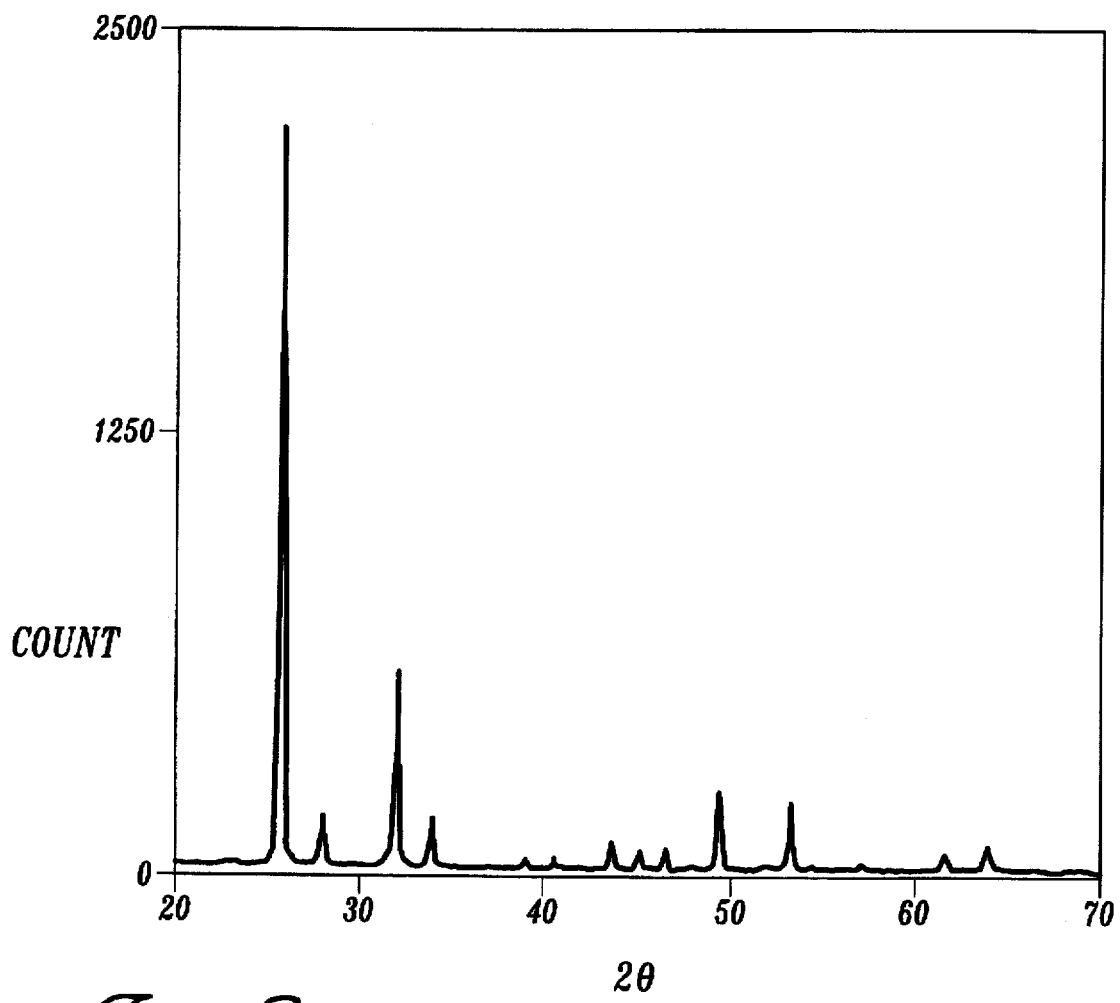
FIG. 2 is the x-ray diffraction of the surface of hydroxyapatite obtained in Example 1 of the present invention.

Strong x-ray diffraction at 2θ-25.8° C. (002) was obtained by subjecting the surface of the hydroxyapatite insulating layer on the polypropylene substrate layer of Example 1 to powder x-ray diffraction. This confirmed the formation of C-axis oriented hydroxyapatite, as shown in FIG. 2. "C-axis oriented" means that the hexagonal surface of the hydroxyapatite crystals are configured in a desired orientation on the surface of the polypropylene substrate layer, and this orientation is confirmed by the fact that the strength of the x-ray diffraction at the hexagonal surface (002) of the hydroxyapatite insulating layer is stronger than the x-ray diffraction obtained for randomly oriented hydroxyapatite.

EXAMPLE 4

It is well known that cytochrome c552 obtained from *Hydrogenobacter thermophilus* is a conductive protein with a very low molecular weight and a high heat stability (J. Bacteriol., 171.65(1989)). An electrode was prepared by vacuum deposition of cytochrome c552 at $1\times10^{-12}$ Torr and 120° C. on the substrate of Example 1 and a functional integrated circuit was obtained by the ion-beam etching of this deposited membrane, following the protocol disclosed above.

EXAMPLE 5

It is possible to form membrane on the substrate of Example 1 by vacuum deposition using any cytochrome at a lower temperature by altering the amount of vacuum. An electrode of cytochrome obtained from cow was prepared by vacuum deposition at $1\times10^{-13}$ Torr and 80° C. on the substrate of Example 1 and a functional integrated circuit was obtained by the plasma etching of this deposited membrane, following the protocol discussed above.

EXAMPLE 6

An electrode of mitochondria obtained from rat liver was prepared by vacuum deposition at $1\times10^{-13}$ Torr and room temperature and a functional integrated circuit was obtained by the ion-beam etching of the deposited membrane, following the protocol discussed above.

While particular embodiments of the present invention have been described in some detail herein above, changes and modifications may be made in the illustrated embodiments without departing from the spirit of the invention.

We claim:

1. A semiconductor integrated circuit comprising:

a substrate layer;

an insulating layer on at least a portion of said substrate layer, said insulating layer comprising apatite molecules substantially aligned in the C-axis (002) orientation; and an electrode layer on at least a portion of said substrate layer, said electrode layer comprising at least one of an electric conductive protein and organella matter containing an electric conductive protein matter.

2. The semiconductor integrated circuit of claim 1 wherein said apatite is selected from the group consisting of hydroxyapatite, fluorinated apatite and chlorinated apatite.

3. The semiconductor integrated circuit of claim 1 wherein said conductive protein is cytochrome and said organella matter is from mitochondria.

4. The semiconductor integrated circuit of claim 3 wherein said cytochrome is selected from the group consisting of cytochrome $a_1$, cytochrome b, cytochrome $b_1$, cytochrome $b_2$, cytochrome $b_3$, cytochrome $b_6$, cytochrome c, cytochrome $c_2$ and cytochrome $c_3$.

5. The semiconductor integrated circuit of claim 3 wherein said cytochrome is cytochrome c.

6. The semiconductor integrated circuit of claim 3 wherein said cytochrome is selected from the group consisting of algae cytochrome, yeast cytochrome, bacteria cytochrome, protozoa cytochrome and mammal cytochrome.

7. A semiconductor integrated circuit comprising:

a substrate layer;

an insulating layer on at least a portion of said substrate layer, said insulating layer comprising apatite molecules substantially aligned in the C-axis (002) orientation; and an electrode layer on at least a portion of said substrate layer, said electrode layer comprising at least one of a conductive cytochrome and conductive mitochondria matter.

8. The semiconductor integrated circuit of claim 7 wherein said apatite is selected from the group consisting of hydroxyapatite, fluorinated apatite and chlorinated apatite.

9. The semiconductor integrated circuit of claim 7 wherein said cytochrome is selected from the group consisting of cytochrome $a_1$, cytochrome b, cytochrome $b_1$, cytochrome $b_2$, cytochrome $b_3$, cytochrome $b_6$, cytochrome c, cytochrome $c_2$ and cytochrome $c_3$.

10. The semiconductor integrated circuit of claim 7 wherein said cytochrome is cytochrome c.

11. The semiconductor integrated circuit of claim 7 wherein said cytochrome is selected from the group consisting of algae cytochrome, yeast cytochrome, bacteria cytochrome, protozoa cytochrome and mammal cytochrome.

12. A semiconductor integrated circuit comprising:

a substrate layer;

an insulating layer on at least a portion of said substrate layer, said insulating layer comprising apatite molecules substantially aligned in the C-axis (002) orientation, said apatite being selected from the group consisting of hydroxyapatite, fluorinated apatite and chlorinated apatite; and an electrode layer on at least a portion of said substrate layer, said electrode layer comprising at least one of cytochrome c and conductive mitochondria matter.

13. The semiconductor integrated circuit of claim 12 wherein said cytochrome is selected from the group consisting of algae cytochrome, yeast cytochrome, bacteria cytochrome, protozoa cytochrome and mammal cytochrome.

* * * * *